(12) United States Patent
Fan

(10) Patent No.: US 12,165,829 B2
(45) Date of Patent: Dec. 10, 2024

(54) SINGLE BEAM PLASMA SOURCE

(71) Applicant: Board of Trustees of Michigan State University, East Lansing, MI (US)

(72) Inventor: Qi Hua Fan, Okemos, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 540 days.

(21) Appl. No.: 17/482,833

(22) Filed: Sep. 23, 2021

(65) Prior Publication Data

US 2022/0013324 A1    Jan. 13, 2022

Related U.S. Application Data

(63) Continuation of application No. PCT/US2020/023869, filed on Mar. 20, 2020.

(60) Provisional application No. 62/823,872, filed on Mar. 26, 2019.

(51) Int. Cl.
| | |
|---|---|
| *H01J 37/08* | (2006.01) |
| *C23C 14/35* | (2006.01) |
| *C23C 14/46* | (2006.01) |

(52) U.S. Cl.
CPC ............. *H01J 37/08* (2013.01); *C23C 14/35* (2013.01); *C23C 14/46* (2013.01); *H01J 2237/0815* (2013.01); *H01J 2237/3146* (2013.01)

(58) Field of Classification Search
None
See application file for complete search history.

(56) References Cited

U.S. PATENT DOCUMENTS

| | | | |
|---|---|---|---|
| 3,321,919 | A | 5/1967 | Marolda |
| 3,952,228 | A | 4/1976 | Reader et al. |
| 3,956,666 | A | 5/1976 | Reader et al. |
| 3,969,646 | A | 7/1976 | Reader et al. |
| 4,481,062 | A | 11/1984 | Kaufman et al. |
| 4,873,467 | A | 10/1989 | Kaufman et al. |
| 4,954,751 | A | 9/1990 | Kaufman et al. |
| 5,032,202 | A | 7/1991 | Tsai et al. |
| 5,246,532 | A | 9/1993 | Ishida |
| 5,304,279 | A | 4/1994 | Coultas et al. |
| 6,454,910 | B1 | 9/2002 | Zhurin et al. |
| 6,456,011 | B1 | 9/2002 | Bugrova et al. |
| 6,608,431 | B1 | 8/2003 | Kaufman |

(Continued)

FOREIGN PATENT DOCUMENTS

| | | |
|---|---|---|
| RU | 2667822 C1 | 9/2018 |
| WO | WO-2011/097183 A2 | 8/2011 |

(Continued)

OTHER PUBLICATIONS

Wikipedia, "Sputtering" article (published Apr. 20, 2018).

(Continued)

*Primary Examiner* — Jason Berman
(74) *Attorney, Agent, or Firm* — Harness, Dickey & Pierce PLC

(57) ABSTRACT

A single beam plasma or ion source apparatus, including multiple and different power sources, is provided. An aspect of the present apparatus and method employs simultaneous excitation of an ion source by DC and AC, or DC and RF power supplies. Another aspect employs an ion source including multiple magnets and magnetic shunts arranged in a generally E cross-sectional shape.

30 Claims, 13 Drawing Sheets

(56) References Cited

U.S. PATENT DOCUMENTS

| | | | |
|---|---|---|---|
| 6,682,634 | B1 | 1/2004 | Kahn et al. |
| 6,750,600 | B2 | 6/2004 | Kaufman et al. |
| 6,843,891 | B2 | 1/2005 | Kahn et al. |
| 6,864,485 | B2 | 3/2005 | Kahn et al. |
| 6,870,164 | B1 | 3/2005 | Baldwin et al. |
| 8,994,258 | B1 | 3/2015 | Kaufman et al. |
| 9,496,376 | B2 | 11/2016 | Yamazaki et al. |
| 11,049,697 | B2 | 6/2021 | Fan et al. |
| 2004/0018320 | A1* | 1/2004 | Nicolussi ............ H01L 21/4835 427/535 |
| 2004/0040031 | A1* | 2/2004 | Sweitzer ............ G06F 9/44505 719/328 |
| 2004/0060813 | A1 | 4/2004 | Chistyakov |
| 2006/0152162 | A1 | 7/2006 | Madocks |
| 2008/0169189 | A1 | 7/2008 | Wei et al. |
| 2011/0127157 | A1 | 6/2011 | Bellido-Gonzalez |
| 2011/0277823 | A1 | 11/2011 | Fan et al. |
| 2012/0025710 | A1* | 2/2012 | Klyuev ................ H01J 37/08 315/111.91 |
| 2013/0244293 | A1 | 9/2013 | Balan et al. |
| 2013/0307414 | A1 | 11/2013 | Choi |
| 2014/0238861 | A1 | 8/2014 | Foret |
| 2014/0313574 | A1 | 10/2014 | Bills et al. |
| 2015/0041454 | A1 | 2/2015 | Foret |
| 2015/0307360 | A1 | 10/2015 | Bills et al. |
| 2016/0027608 | A1 | 1/2016 | Madocks |
| 2016/0148775 | A1* | 5/2016 | Madocks ................ H01J 27/10 250/424 |
| 2016/0215111 | A1 | 7/2016 | Bilek et al. |
| 2016/0276134 | A1 | 9/2016 | Collins et al. |
| 2016/0322174 | A1 | 11/2016 | Fan et al. |
| 2016/0351404 | A1 | 12/2016 | Aramaki et al. |
| 2017/0029936 | A1 | 2/2017 | Chistyakov |
| 2018/0073133 | A1 | 3/2018 | Bertran Serra et al. |
| 2018/0087151 | A1 | 3/2018 | Manabe et al. |
| 2019/0242838 | A1* | 8/2019 | Gillman ................ H05H 1/4697 |

FOREIGN PATENT DOCUMENTS

| | | |
|---|---|---|
| WO | WO-2018/175689 A1 | 9/2018 |
| WO | WO-2019/246296 A1 | 12/2019 |

OTHER PUBLICATIONS

Kurt J. Lesker Company, www.lesker.com/newweb/chambers/std_sphericalchamber.cfm (Internet page published at least as early as May 14, 2018).

Kurt J. Lesker Company, "Torus® Circular UHV (Ultra High Vacuum) Magnetron Sputtering Sources" (published at least as early as May 14, 2018).

Kurt J. Lesker Company, "Torus® 10 CA Performance Magnetron Production Cathodes" (published at least as early as May 14, 2018).

Kurt J. Lesker Company, "Torus® Linear Magnetrons," www.lesker.com (published at least as early as May 14, 2018).

Kurt J. Lesker Company, "R&D Magnetron Sputtering Sources Overview" (published at least as early as May 14, 2018).

Kurt J. Lesker Company, "Torus® MagKeeper™ Magnetron Sputtering Sources," www.lesker.com (published at least as early as May 14, 2018).

Hughes, M., Semicore Equipment, Inc., "What is DC Sputtering?" (published Nov. 26, 2016).

Hughes, M., Semicore Equipment, Inc., "What is RF Sputtering?" (published Oct. 27, 2016).

Wikipedia, "Sputter deposition" (published Dec. 14, 2017).

Hopwood, J., et al., "Langmuir probe measurements of a radio frequency induction plasma," Journal of Vacuum Science & Technology A: Vacuum, Surfaces, and Films (1993).

Dehkhoda, A., et al., "A novel method to tailor the porous structure of KOH-activated biochar and its application in capacitive deionization and energy storage," Biomass and Bioenergy (2016).

Talukder, A., "Plasma treatment of zinc oxide thin film and temperature sensing using the zinc oxide thin film," <https://openprairie.sdstate.edu/cgi/viewcontent.cgi>?article=2048&context=etd (2016).

Foggiato, J., "Handbook of Thin-Film Deposition Processes and Techniques, Second Edition—Chapter 3: Chemical Vapor Deposition of Silicon Dioxide Films," Noyes Publications, 54 pages (2002).

Gabriel, O., et al., "Plasma monitoring and PECVD process control in thin film silicon-based solar cell manufacturing," EPJ Photovoltaics 5, 9 pages (Feb. 5, 2014).

Henkel, C., et al., "Deposition of dielectrics and metal gate stacks (CVC, ALD), Lecture 8," KTH, 57 pages (published Spring 2013).

Menendez, A., et al., "Depositions of Thin Films: PECVD Process," Silicon Based Thin Film Solar-Cells, pp. 29-57 (2013).

Talukder, A., et al., "Improving electrical properties of sol-gel derived zinc oxide thin films by plasma treatment," Journal of Applied Physics 120, 155303, 24 pages (2016).

Wang, K., et al., "Low-temperature plasma exfoliated n-doped graphene for symmetrical electrode supercapacitors," Nano Energy Journal, vol. 31, Journal Issue C, Journal ID: ISSN 2211-2855, 27 pages (Jan. 1, 2017).

Summary of prior capacitively coupled and inductively coupled plasma sources (publicly used prior to Jan. 2017).

South Dakota State University, "Reducing cost of producing supercapacitors," www.sciencedaily.com, 2 pages (Aug. 18, 2016).

"SDSU Researchers Use Biochar to Develop Cost-Effective Supercapacitors," www.azom.com, 3 pages (Aug. 22, 2016).

South Dakota State University, "Transforming biochar into activated carbon," www.sciencedaily.com, 2 pages (Jan. 30, 2015).

Simpson, J., "Plasma Etching of Biochar Reduces Supercapacitor Costs," Engineering 360, 1 page (Sep. 7, 2016).

Zeng, A., et al., "Plasma Treated Active Carbon for Capacitive Deionization of Saline Water," 16 pages (published prior to Jul. 18, 2019).

Neodymium Ring Magnet—RZ0Y0X0, www.kjmagnetics.com, 6 pages (offered for sale prior to Jul. 18, 2019).

Summary of prior capacitively coupled and magnetically enhanced RF plasma discharge systems (publicly used or disclosed prior to July of 2018).

"Plasma-enhanced chemical vapor deposition," www.wikipedia.com, 3 pages (Jul. 17, 2018).

Patent Cooperation Treaty, International Search Report and Written Opinion (Jul. 30, 2020).

\* cited by examiner

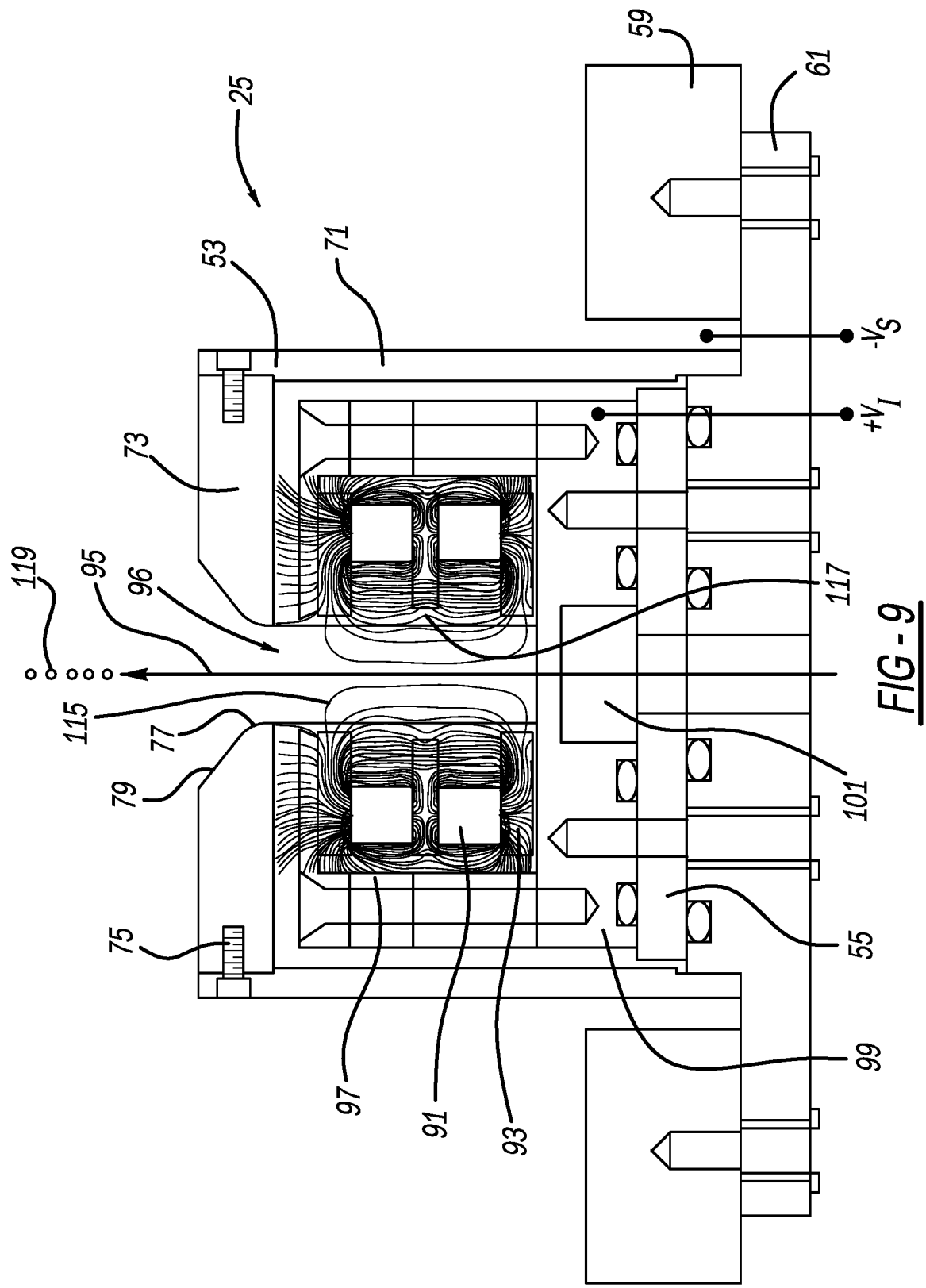

SINGLE BEAM PLASMA SOURCE

CROSS REFERENCE TO RELATED APPLICATION

This application is a continuation of PCT International Application No. PCT/US2020/023869, filed on Mar. 20, 2020, which claims priority to U.S. Provisional Patent Application Ser. No. 62/823,872, filed Mar. 26, 2019, which are incorporated by reference herein.

GOVERNMENT RIGHTS

This invention was made with government support under 1700785, 1700787 and 1724941 awarded by the National Science Foundation. The government has certain rights in the invention.

BACKGROUND AND SUMMARY

The present application generally pertains to an ion source and more particularly to a single beam plasma or ion source apparatus.

Ion sources are widely used for surface engineering and thin film deposition. Energetic ions created from an ion source can enhance surface reactions, sputter a target, and modulate surface roughness. Hence, ion sources have been an important tool in manufacturing semiconductor integrated circuits, flat panel displays and functional coatings.

Furthermore, thin film processing is widely used for manufacturing semiconductor devices, displays, solar panels, tribological coatings, sensors and micro-electro-mechanical systems. Conventional physical and chemical vapor depositions generally result in loosely packed atoms 1 on a workpiece 2 due to their limited kinetic energies, as is shown in FIG. 1. The micro-porous structures lead to unstable material properties and device performance. Nevertheless, ion sources have become the essential tools for manufacturing high-quality thin films and devices.

One conventional ion source is of a racetrack design illustrated in FIGS. 2 and 3. This device consists of a racetrack- or ring-shaped anode 3, a pair of center and outer magnetic poles, and magnets 4. The anode is connected to the positive terminal of a DC power supply. The magnetic poles are connected to a ground potential and act as cathodes 5. Electrons attracted toward the anode experience a Lorenz force that drives the electrons in E×B direction (where E is an electrical field vector and B is a magnetic induction field vector). Hence, the electrons drift along the racetrack in an electron trajectory 6 instead of directly reaching the anode. The confined electrons ionize the process gases and create ions 7, which are subsequently extracted out of the plasma region.

There are two critical requirements for the racetrack ion sources to operate properly: 1) the electrons must drift in a closed loop (a racetrack or a circular ring) to ensure they are confined; and 2) the gap between the anode and cathode must be small (a few millimeters) to create a strong electrical field to extract the ions. Hence, a racetrack linear source actually produces two beams in the straight section and a circular source generates a ring-shaped beam. Therefore, the emitted ions have a wide distribution of emission angle; research has shown that the associated ion incident angle has a notable effect on the morphology of the treated surfaces. It has been known from semiconductor processing that the morphologies of ion-beam-treated surfaces strongly depends on the incident angles of the ions. The wide beam angles of racetrack configurations limit the ability to tune the ion-surface interactions and subsequently the optimization of ion-assisted processing. Several alternate types of ion sources could produce a focused beam. However, these ion sources need an electron emission source, which operates only in inert gas at very low pressures not compatible with thin film processing.

Furthermore, the racetrack ion sources require a voltage greater than 250 V to sustain the plasma discharges. This is determined by the electromagnetic fields in between the anode and cathode. Therefore, the ion energies could be so high that they can damage the deposited films and undesirably roughen the film surfaces.

The narrow emission slit in the traditional racetrack ion sources results in frequent maintenance due to undesired material deposition and contamination of the anode and cathode adjacent the exit slit. Furthermore, it is troublesome to realign the cathode after cleaning to maintain a uniform emission slit since the traditional racetrack construction mounts the magnetic steel cathode directly onto the magnets. Exemplary racetrack configurations are disclosed in U.S. Patent Publication No. 2016/0027608 entitled "Closed Drift Magnetic Field Ion Source Apparatus Containing Self-Cleaning Anode and a Process for Substrate Modification Therewith" which published to Madocks on Jan. 28, 2016, and U.S. Patent Publication No. 2017/0029936 entitled "High Power Pulse Ionized Physical Vapor Deposition" which published to Chistyakov on Feb. 2, 2017, both of which are incorporated by reference herein.

Another traditional ion source is disclosed in U.S. Pat. No. 4,481,062 entitled "Electron Bombardment Ion Sources" which issued to Kaufman et al. on Nov. 6, 1984, and is incorporated by reference herein. This approach commonly works at low pressure (for example, $10^{-4}$ Torr) which is incompatible with a typical sputtering pressure of at least $10^{-3}$ Torr. Furthermore, the Kaufman ion source undesirably uses a filament to thermionically emit electrons which makes it unsuitable for use with reactive gases. Moreover, the design typically employs metal grids across an outlet, thereby disadvantageously being prone to contamination, and requiring frequent downtime and maintenance.

In accordance with the present invention, a single beam plasma or ion source apparatus, including multiple and different power sources, is provided. An aspect of the present apparatus and method of use employs simultaneous excitation of an ion source by DC and AC, or DC and RF power supplies. A further aspect of an ion source includes magnets and/or magnetic shunts which create a magnetic flux with a central dip or outward undulation located in an open space where a plasma is created. Another aspect employs an ion source including multiple magnets and at least three magnetic shunts arranged in a generally E cross-sectional shape, using a DC, or DC and AC power source, and with a cathode body or cap being magnetic metal. In another aspect, an ion source includes a removable cathode, cap or cover isolated from an anode body which surrounds the magnets such that the cathode body and cap can be easily removed for cleaning. Yet a further aspect provides a single beam plasma source which generates ions simultaneously with other deposition sources (such as sputtering magnetrons and plasma enhanced chemical vapor deposition equipment) at the same process pressure. Another aspect uses a single beam ion source for direct thin film deposition by either pointing the ion beam to and sputtering a target, or introducing a precursor gas that is subsequently dissociated by the ion source plasma.

The present plasma source apparatus is advantageous over traditional devices. For example, the present apparatus and method are well suited for use at low pressure and/or for standalone operation (e.g., without a sputtering magnetization in the same chamber) of the ion source, such as to perform surface cleaning or evaporation deposition of thin films. The present apparatus advantageously emits a single ion beam, the cross-sectional diameter or width of which can be modulated from about 3 mm to at least 30 mm, and it can be made to any length in a single beam linear configuration. Moreover, the beam of the present apparatus can be generated in a wide range of operating pressures (for example, 1 mTorr to >500 mTorr) which is compatible with simultaneous sputtering. The present apparatus beneficially operates with many different gases including inert and reactive gases since it does not use a filament. Furthermore, the present ion source can operate over a wide range of discharge voltages from 10 to greater than 500 V that lead to tunable ion energies for optimal ion-surface interactions.

The present apparatus and method of use are also advantageous for long-term stable operation since: 1) the anode is unlikely to be contaminated because no direct coating flux can reach the active surfaces; 2) the cathode is not sensitive to the coatings because it can be set at a floating potential and gets automatically biased; and 3) the cap or cover can be easily disassembled and reassembled for maintenance, as compared to conventional devices. It is noteworthy that the present apparatus emits a stable ion beam without interference with other plasma sources that simultaneously operate. Another advantage is the single beam ion source leads to significant decrease in the discharge voltage of a sputtering source and subsequently improves a sputtered film quality. Moreover, the multiple and different power source feature of the present apparatus and method can optionally be used to excite a racetrack ion source in order to reduce its discharge voltage. Additional features and benefits will become apparent from the following description and appended claims taken in conjunction with the accompanying drawings.

BRIEF DESCRIPTION OF THE DRAWINGS

FIG. 9 is a cross-sectional view, like that of FIG. 5, showing magnetic flux lines and ion emissions from the present ion source, where the cathode is connected to ground potential;

DETAILED DESCRIPTION

Figure 1:
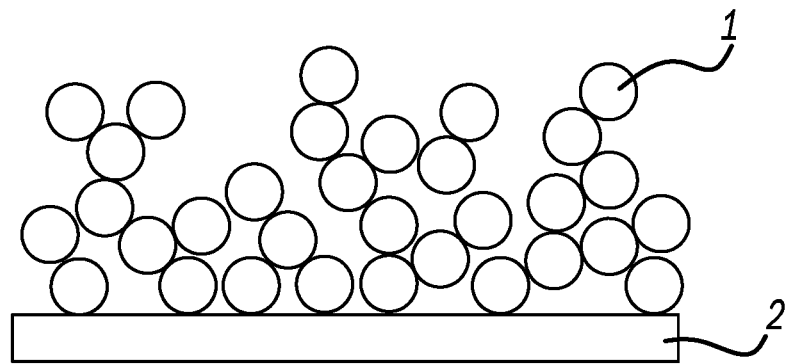
FIG. 1 is a diagrammatic cross-sectional view showing prior art coating atoms on a workpiece without the assistance of an ion source.
Figure 2:
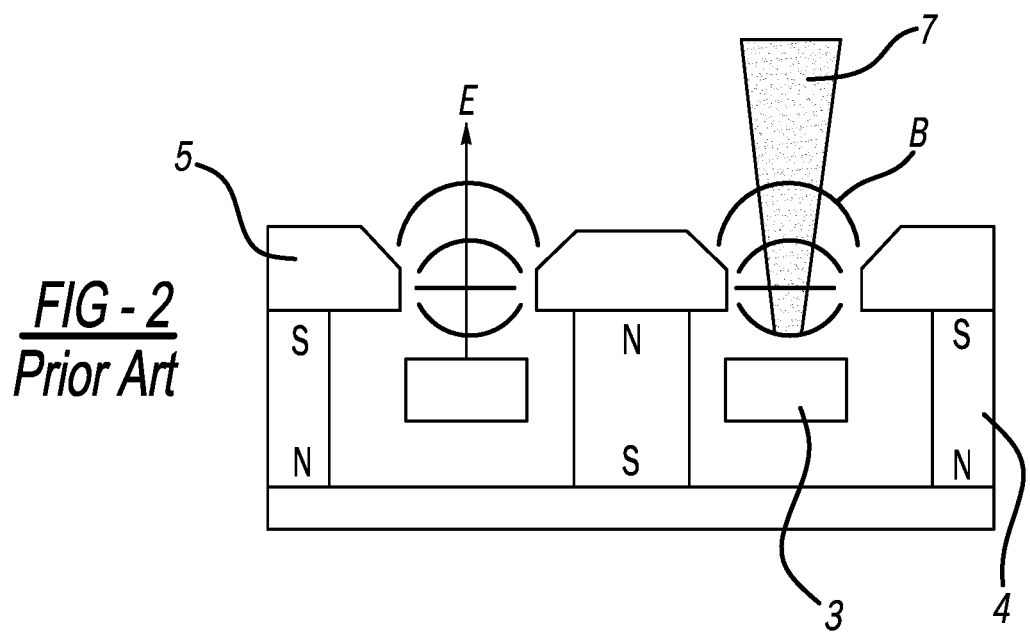
FIG. 2 is a diagrammatic cross-sectional view showing a prior art ion source.
Figure 3:
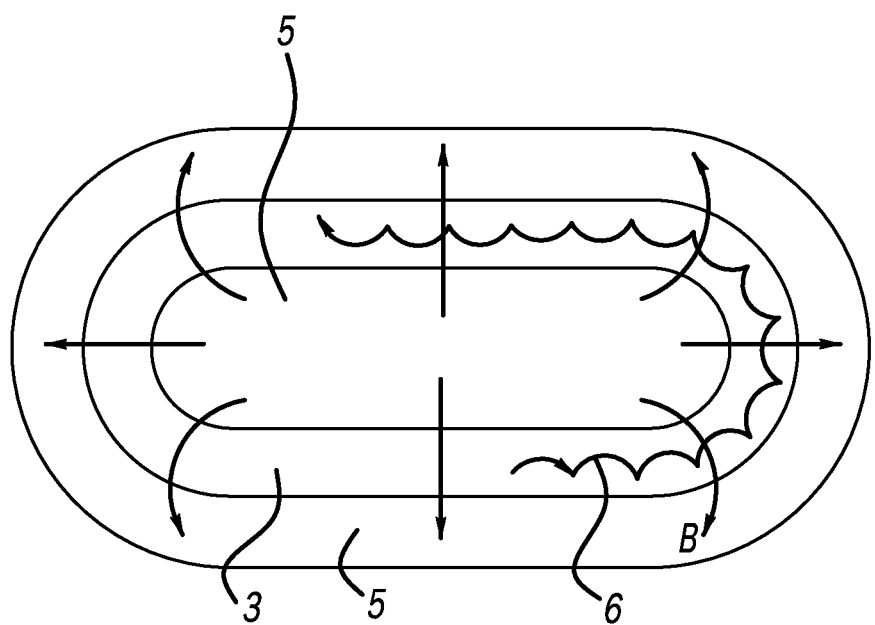
FIG. 3 is a diagrammatic top view showing the prior art ion source of FIG. 2.
Figure 4:
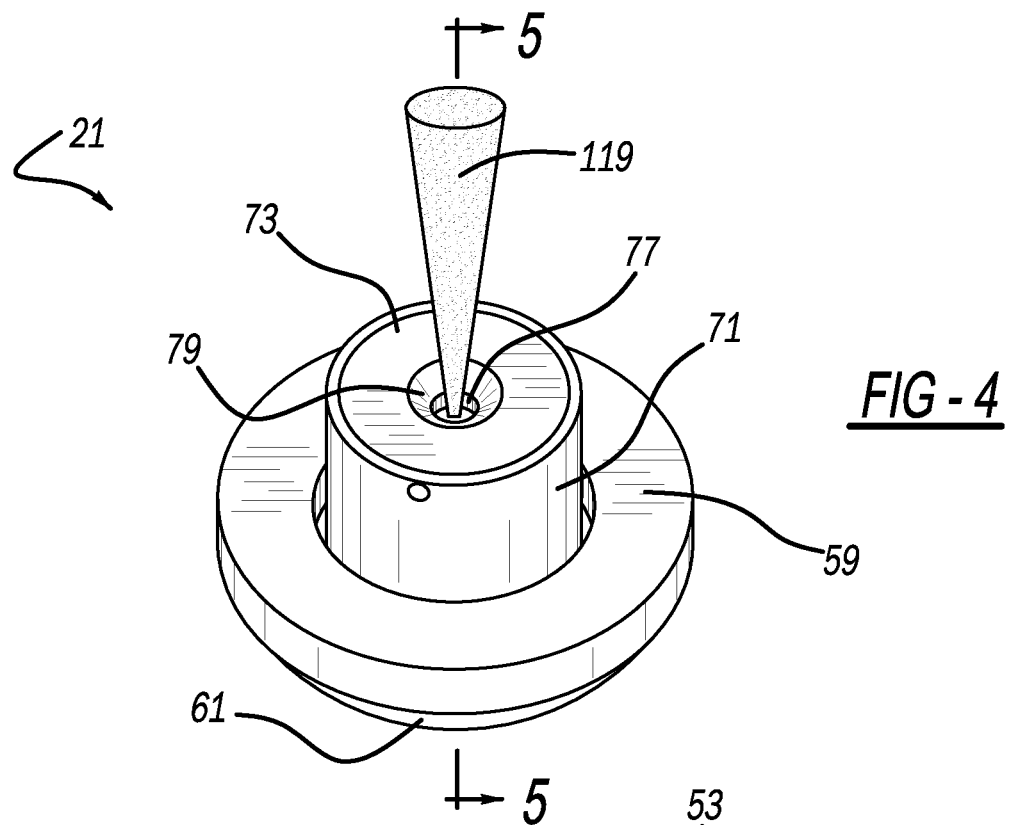
FIG. 4 is a perspective view showing the present ion source.

A preferred embodiment of a single beam plasma or ion source apparatus 21 can be observed in FIGS. 4-8 and 12. Ion source apparatus 21 includes a vacuum chamber 23, an ion source 25, a deposition source 27, and a specimen or workpiece 29. Ion source 25 and deposition source 27 are mounted to vacuum chamber 23 through vacuum-sealed ports. The apparatus also includes a pumping port connected to a vacuum pump 31, an input gas port connected to a process gas source, pressure gauges and optional heaters. Various configurations of the vacuum chamber exist, depending upon the specific functions desired of the system.

Exemplary ion source 25 includes an anode 51 and a cathode 53. The anode is mounted upon an insulator 55. The cathode is mounted on a metallic closure plate 61, which in turn is mounted to flange 59 on vacuum chamber 23. In this case, cathode 53 is set at an electrical ground potential. Cathode 53 can be a single piece or two pieces that include an external structural body 71 and an end cap 73 removeably fastened thereto via screws 75. Cap 73 of cathode 53 inwardly overhangs anode 51 with a single through-opening 77 in a center thereof defining an ion emission outlet. In the presently illustrated embodiment, structural body 71 and cap 73 of cathode 53 have circular peripheries and opening 77 is circular. Furthermore, the presently illustrated cap 73 employs a frustoconically tapered surface 79 adjacent through-opening 77. Body 71 and cap 73 of cathode 53 may be either a magnetic steel or non-magnetic metal.

It is alternately envisioned that other arcuate shapes such as ovals or other single apertured, elongated hole shapes may be employed for these noted components. An alternate embodiment can be observed in FIGS. 14 and 15 where a tapered single through-opening 677 in a cap 673 of a cathode 653 is linearly elongated in a lateral direction generally perpendicular to an emission central plane or direction of ions 619. The internal anode components are also laterally elongated surrounding a plasma area below opening 677.

Figure 5:
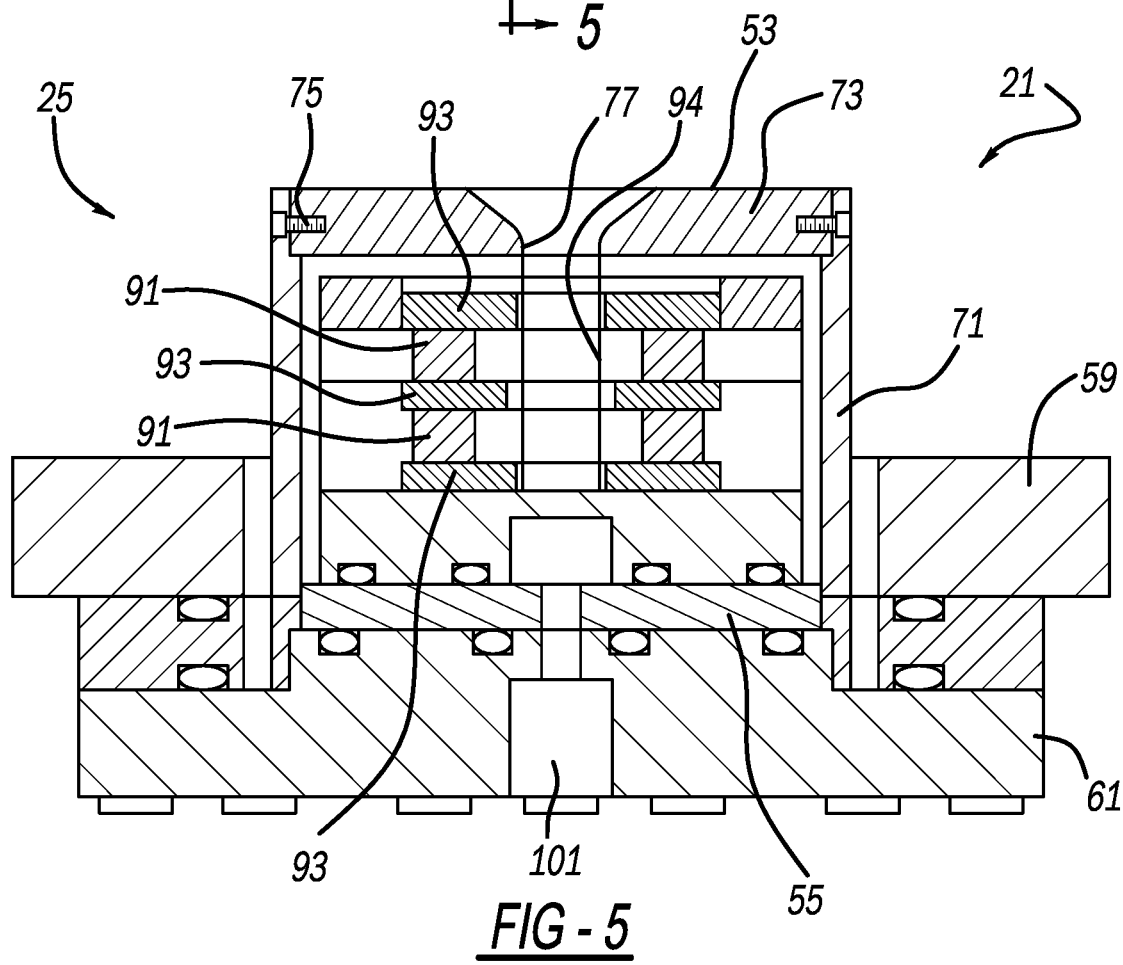
FIG. 5 is a cross-sectional view, taken along line 5-5 of FIG. 4, showing the present ion source, where the cathode is isolated from ground.
Figure 6:
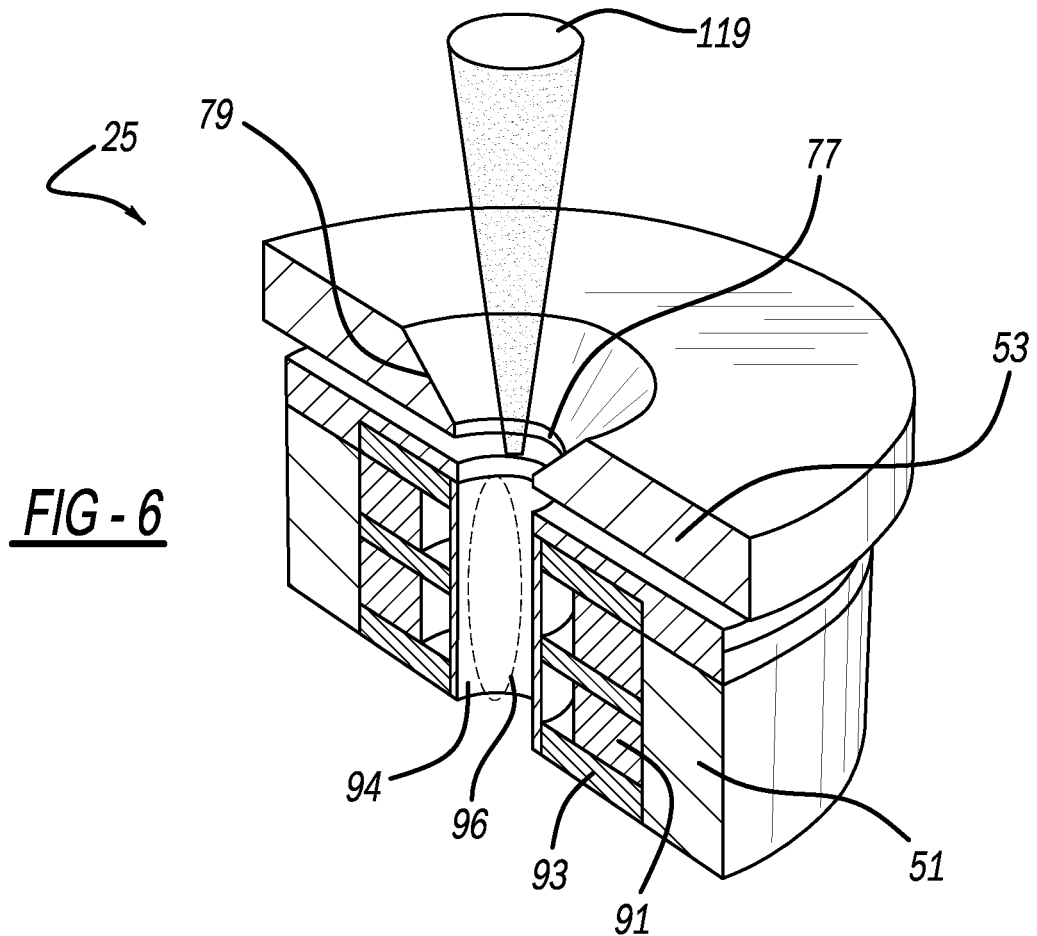
FIG. 6 is a partially fragmented perspective view showing the present ion source.
Figure 10:
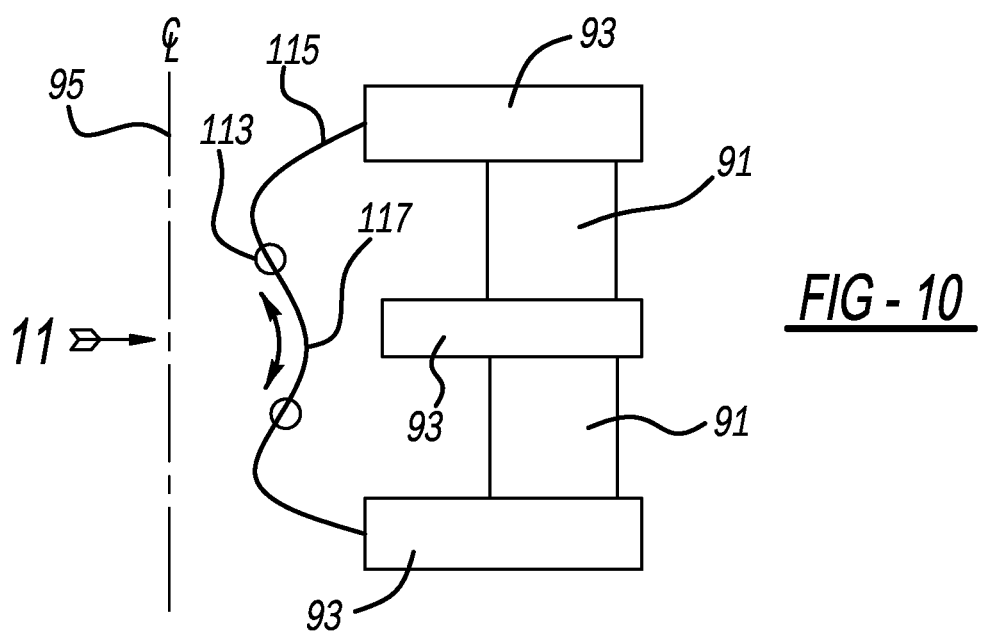
FIG. 10 is a diagrammatic cross-sectional view showing an exemplary magnet assembly used in the present ion source.
Figure 7:
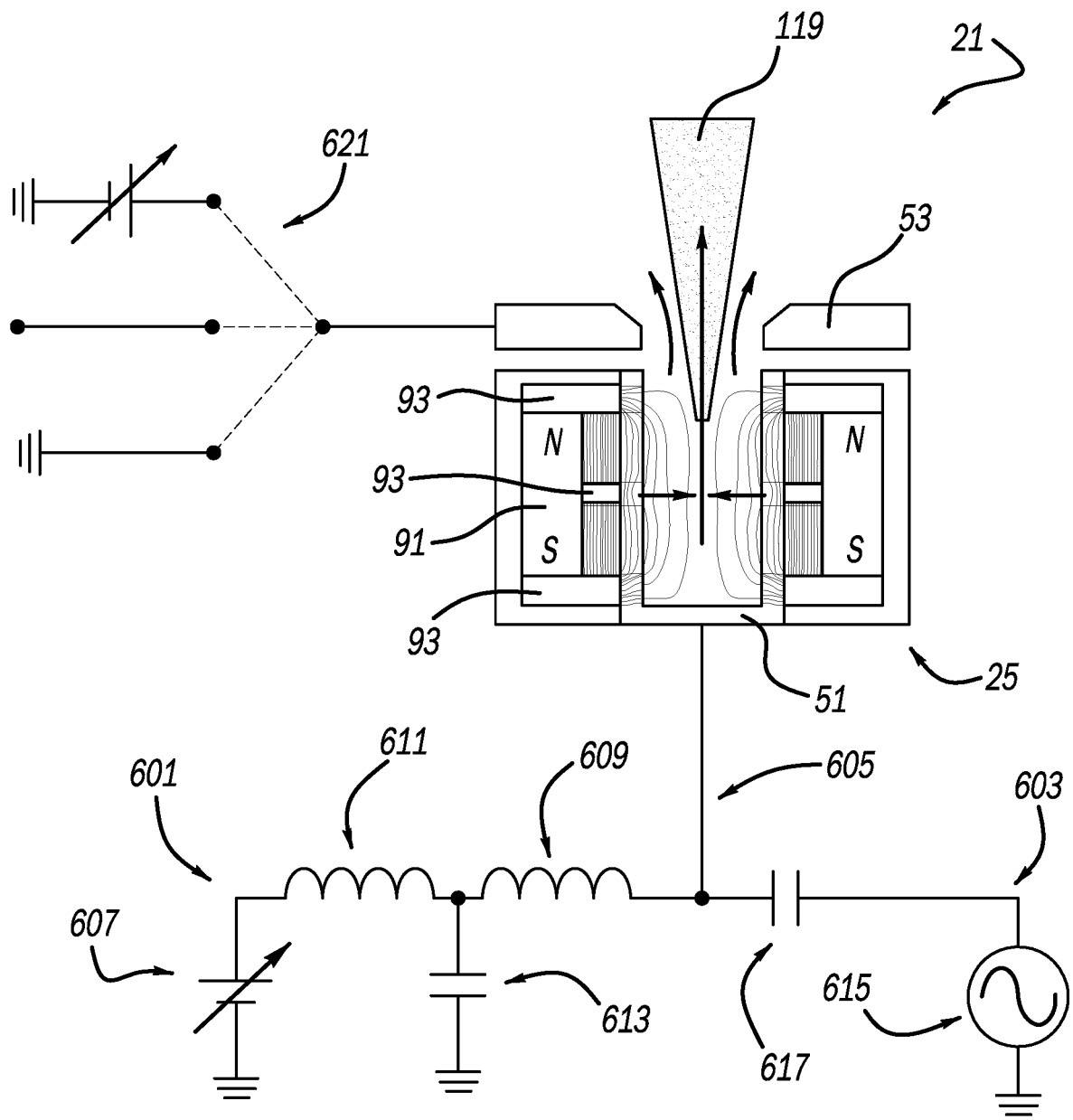
FIG. 7 is a cross-sectional view, like that of FIG. 5, showing electrical circuits used in the present ion source.

Returning to the exemplary embodiment illustrated in FIGS. 5-7, multiple permanent magnets 91, preferably two, and multiple magnetic shunts 93, preferably three, are enclosed in anode 51. An electrically conductive internal cover 94 defines an open plasma region or area 96 essentially aligned with opening 77. Magnets 91 and shunts 93 each have coaxially aligned, circular internal edges and circular external edges wherein they are each ring-shaped with a hollow center. Magnets 91 are sandwiched or stacked between the shunts 93 such that the magnets are spaced apart from each other by the middle shunt. The upper and lower magnets are placed in series, e.g. N-S/N-S or S-N/S-N. Moreover, the cross-section of each side of the magnet and shunt assembly has a generally E-shape with the elongated and internal edges of shunts 93 extending toward a centerline axis 95 of ion source 25. Magnets 91 and shunts 93 are internally secured within an anode body 97 which is coupled to an anode base 99 via screws or other threaded fasteners. An optional incoming gas or cooling fluid inlet 101 and associated passageways are disposed through anode base 99, insulator 55 and plate 61. It is noteworthy that all of anode 51, including magnets 91 and shunts 93, are spaced internally away from all of cathode 53 either by a gap or insulator.

In the FIG. 5 configuration, the cathode is isolated from ground at an electrically floating or biased potential. In the FIG. 9 version, however, the cathode is connected to ground potential through flange 59. Nevertheless, the cathode can be set at bias, floating or ground potential in either version, as represented in FIG. 7.

Figure 8:
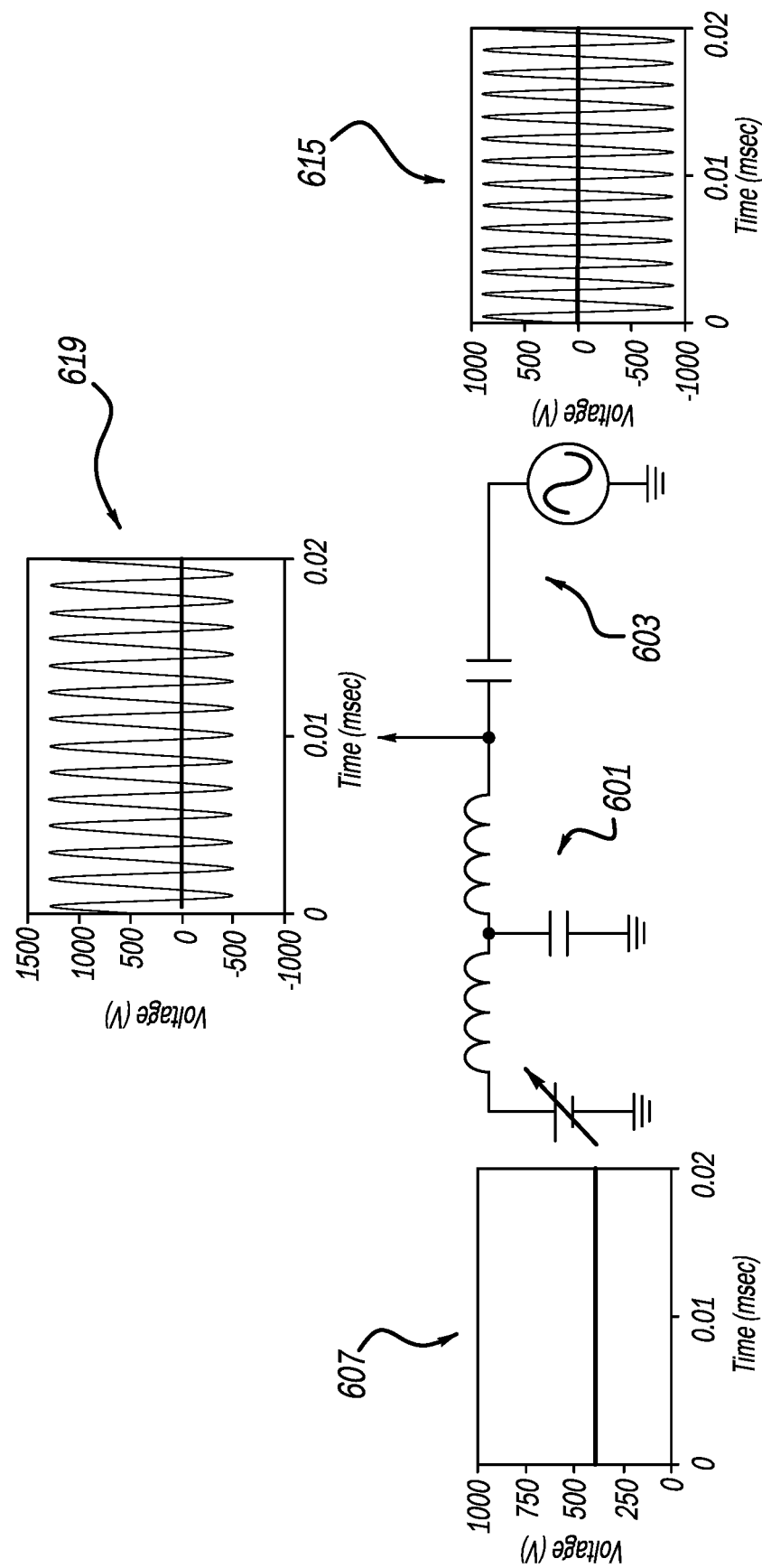
FIG. 8 is a diagrammatic view graphically showing multiple different power sources employed in the present ion source.
Figure 11:
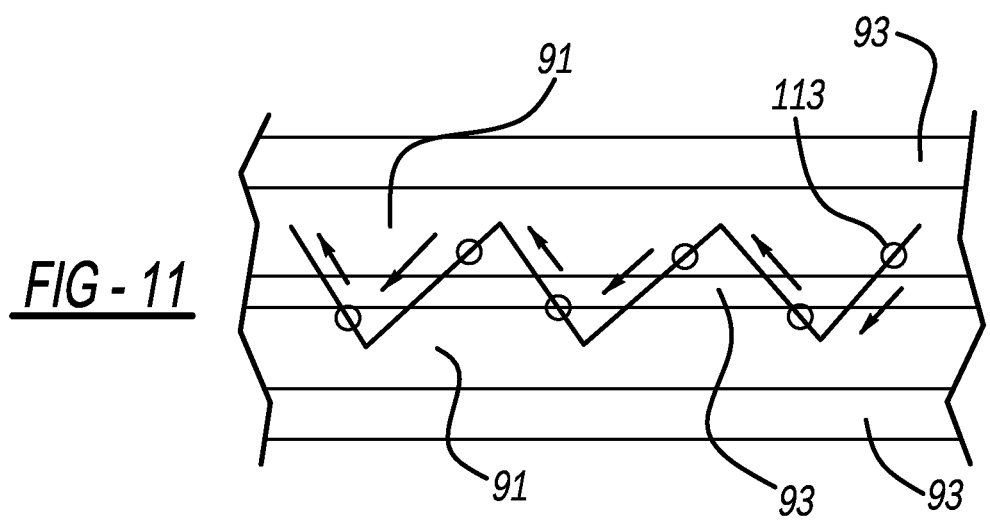
FIG. 11 is a diagrammatic view, taken in the direction of arrow 11 from FIG. 10, showing the present ion source.

A preferred electrical arrangement for the present single beam plasma or ion source apparatus 21, and associated method use, can be observed in FIGS. 7 and 8. A direct current ("DC") electrical circuit 601 and an alternative current ("AC") electrical circuit 603 are electrically connected to anode 51 to create a multiple and different power source electrical input circuit 605. DC circuit 601 includes a DC power supply 607, a first inductor 609, an optional second inductor 611 and an optional capacitor 613.

Furthermore, AC circuit 603 includes an AC power supply 615 and a capacitor 617. The preferred AC frequency is greater than 10 kHz, and includes a radio frequency ("RF") of 13.56 MHz. A preferred operating impedance of capacitor 617 is less than 10Ω and for inductor 609 is greater than 500Ω. A filter network isolates the DC and AC power sources. The ion source is simultaneously excited by this DC+AC (or RF) multiple power source construction. The graphs show DC power at 607, AC power at 615 and the combined DC+AC power to the ion source at 619. As previously mentioned, cathode 53 can be set at bias, floating or ground potential through an electrical circuit 621.

Figure 16:
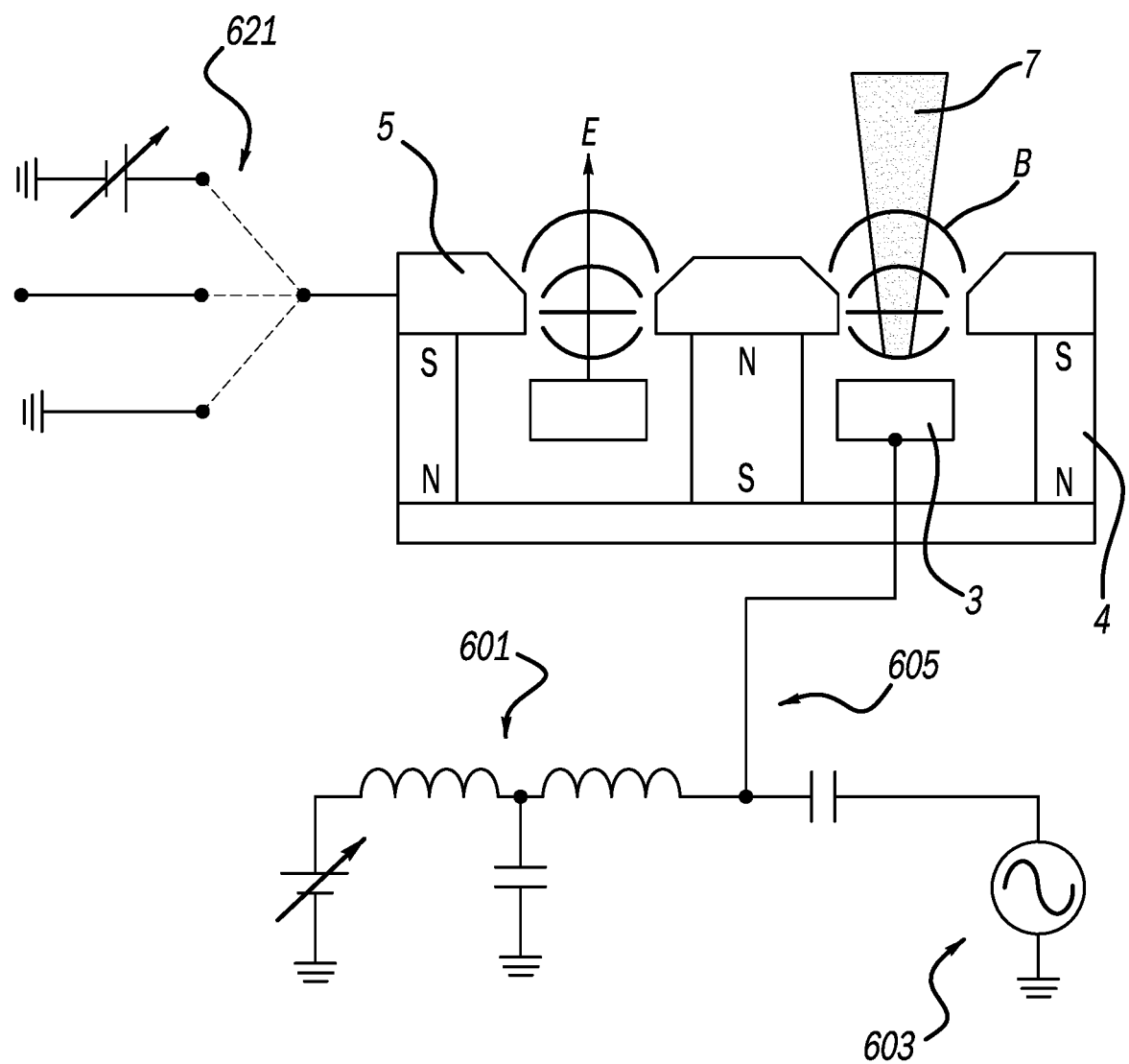
FIG. 16 is a cross-sectional view showing another alternate embodiment of the present ion source.

The advantages of using AC (RF)+DC to excite ion source 25 are:
- The ion source discharge voltages can be reduced to <10 V—this allows the ion sources to treat sensitive surfaces.
- The discharge gas pressure can be further reduced to ~1 mTorr—this can broaden the ion source applications to thin film deposition that benefits with low pressure.
- The ion source can operate alone without having a sputtering magnetron in the same process chamber—this makes the ion source suitable for surface cleaning that only uses an ion source.
- The method of using AC (RF)+DC to excite ion sources can be applied to a racetrack ion source to reduce the discharge voltage, as is illustrated in FIG. 16.

Figure 14:
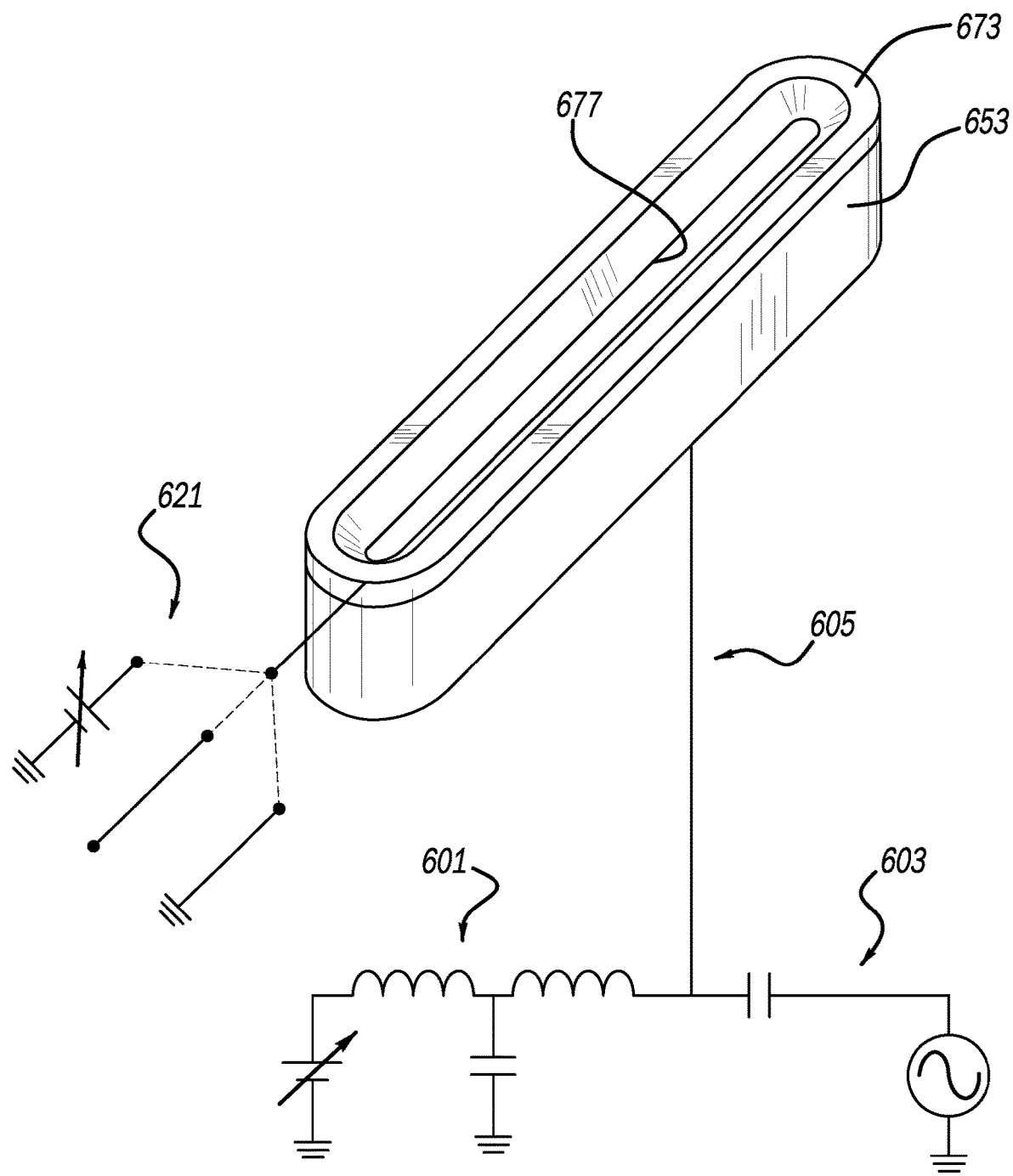
FIG. 14 is a perspective view showing an alternate embodiment of the present ion source.
Figure 15:
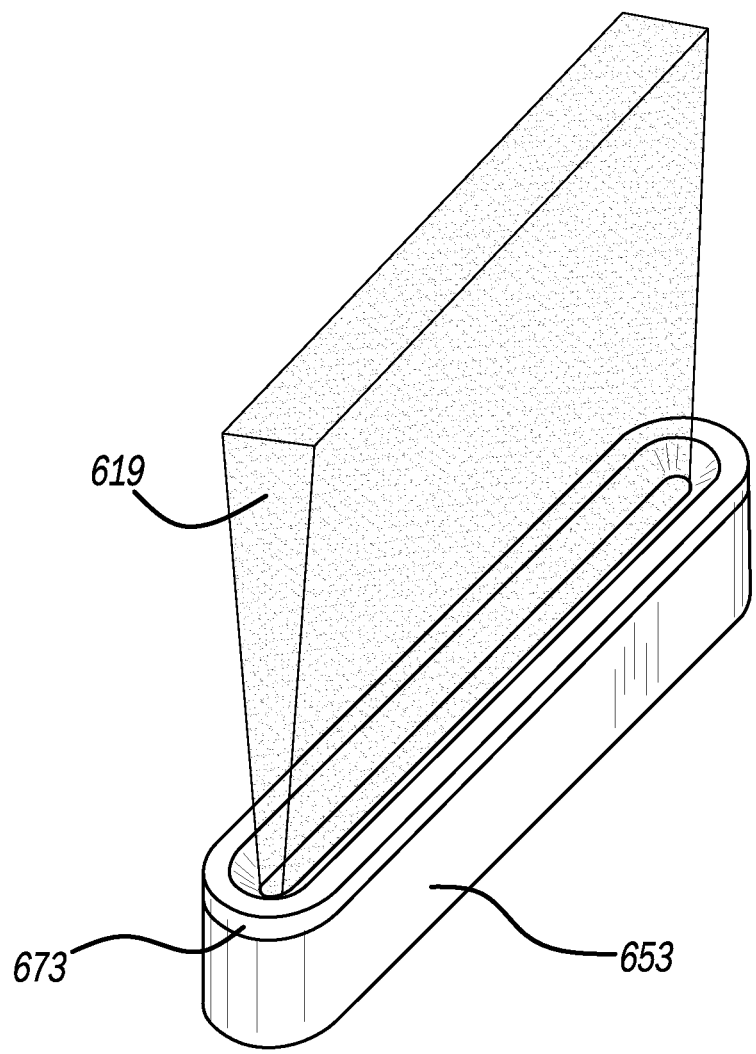
FIG. 15 is a perspective view showing the alternate embodiment ion source of FIG. 14.

Multiple power electrical circuits 601, 603 and 605 may also be employed with the alternate oval shaped ion source of FIGS. 14 and 15.

It is alternately envisioned that a DC only power source be employed with a magnetic steel and a nonmagnetic material for body 71 and/or cap 73 of cathode 53. This is ideally suited for the multiple magnetic and shunt arrangement of a single ion source as is illustrated in FIGS. 5 and 9. In this arrangement, the DC-only circuitry is simpler and less expensive than the preferred DC+AC circuits. The DC-only power is preferably 10 V to at least 300 V to assist with sputtering. For non-sputtering uses, the DC-only power may be at least 100 V.

FIGS. 9-12 illustrate ion source apparatus 21 in operation. When energized, a precursor gas in an open plasma area 96 internal to anode 51 is converted into a plasma due to the energetic electrons 113 moving between the portions of the magnet and shunt assembly as acted upon by the associated electromagnetic fields. Magnetic flux lines 115 flow from one top shunt 93 to the bottom outer shunt 93 or vice versa. Furthermore, a dip 117 or outwardly depressed undulation of at least some of the magnet flux lines 115 are caused by the magnetic assembly. This dip 117 advantageously serves to delay and/or trap adjacent electrons 113 as they are otherwise flowing along magnetic flux lines 115 and reach the anode. This dip therefore advantageously increases ionization and promotes flux density of ions 119 emitted through outlet opening 77 of cathode cap 73 coaxially aligned with a longitudinal centerline axis 95. In certain configurations, the center shunt 93 is optional. Alternately, it is envisioned that multiple dips 117 may be provided between originating and terminating ends of the magnetic fields 115 within open plasma area 96.

The presently preferred construction of ion source 25 allows for adjustability of ion beam 119 from 3 mm to at least 30 mm in diameter or lateral width. This can be achieved through different sizing of outlet 77, magnets 91, and shunts 93. Furthermore, a single ion beam 119 is emitted from ion source 25 with the ions almost uniformly distributed around a center axis when viewed in cross-section, as contrasted to the traditional ring-like and hollow center ion beams generated from the racetrack ion sources. Moreover, while the presently preferred magnets 91 and shunts 93 are hollow annular rings coaxially aligned with centerline 95 in a circular single beam ion source, they may alternately consist of multiple solid rod or bar-like magnets that are arranged about centerline 119 in a circular or arcuate pattern, although some of the preferred advantages may not be realized. In a linear single beam ion source, the ends include half of the circular configuration described above and the straight section may consist of multiple solid rod or bar-like magnets. It is also alternately envisioned that more than two stacked magnets or electromagnets may be employed and if so, additional associated shunts may be provided so as to extend the generally E-cross-sectional configuration with more than three inwardly extending teeth or projecting edges.

Figure 12:
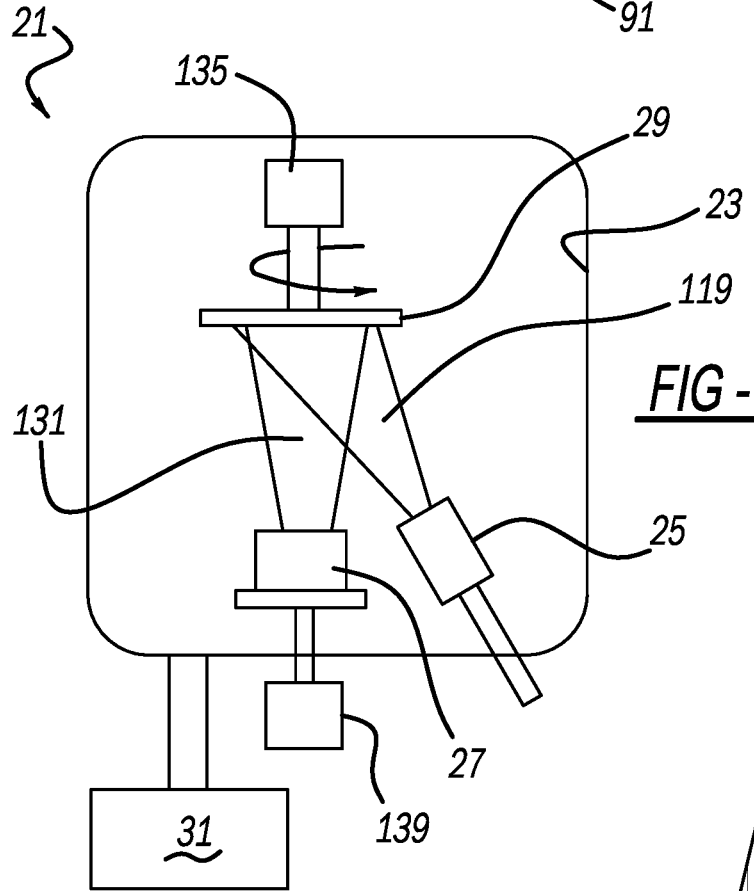
FIG. 12 is a diagrammatic view showing the present plasma or ion source apparatus in simultaneous operation with a deposition source inside a vacuum chamber.
Figure 13:
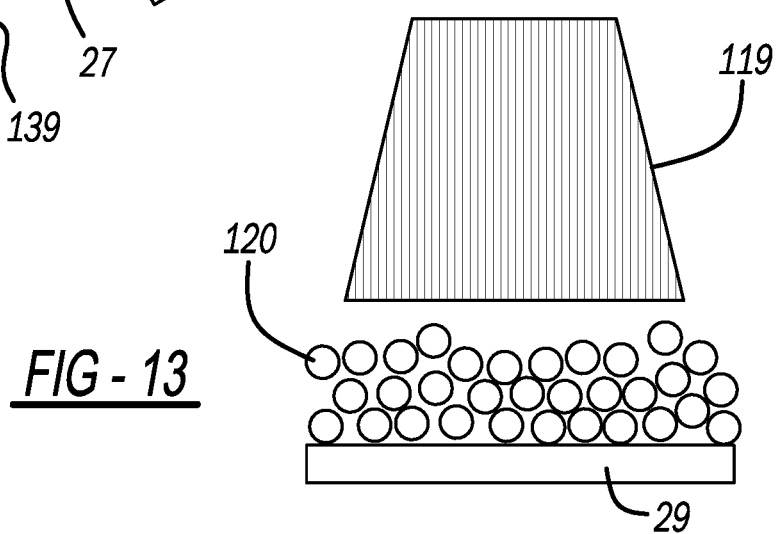
FIG. 13 is a diagrammatic cross-sectional view showing an interaction of coating atoms on a workpiece using the present ion source.

In one exemplary embodiment shown in FIG. 12, ion beam 119 is transmitted from ion source 25 to specimen 29, where target material 131 is subsequently deposited onto the surface of specimen 29 from source 27. In one structural configuration, specimen 29 is coupled to an electromagnetic actuator 135, such as an electrical motor or solenoid. A similar electromagnetic actuator 139 is coupled to source 27. These optional electromagnetic actuators 135 and 139 can impart rotational and/or linear movement to specimen 29 and source 27. The present ion source assisted deposition effectively overcomes the conventional loose atom packing problem and advantageously produces dense films with superior stability, smooth film surface, high electric conductivity, and strong coating adhesion, due to dense packing of atoms 120, as illustrated in FIG. 13.

In a production setting, the apparatus components can be set vertical or horizontal. Furthermore, the specimen can be rigid or flexible. It is also noteworthy that a conveyor or roller system may be employed with any of the embodiments disclosed in the present application. The ion beam interacts with deposited thin film, which is expected to directly improve characteristics of the film such as density, electric conductivity and barrier properties. This ion beam assisted thin-film growth is ideally suited for achieving super-smooth thin films and also to fabricate polycrystalline thin films at low temperatures such as room temperature.

The present ion source apparatus advantageously allows a wide range of operating pressures, such as those from 1 mTorr to 500 mTorr, which allow the ion creation and emission to be entirely compatible with sputtering. Furthermore, the present ion source apparatus advantageously allows ion creation and emission independent of the operating gas since no filament is used; thus, argon, oxygen and other inert and reactive gases may be used. The present ion source also works in a voltage control mode or a current control mode, and the discharge voltages can be as low as 10 volts. Moreover, the narrow focused ion beam advantageously provides a stable discharge without arcing.

Figure 17:
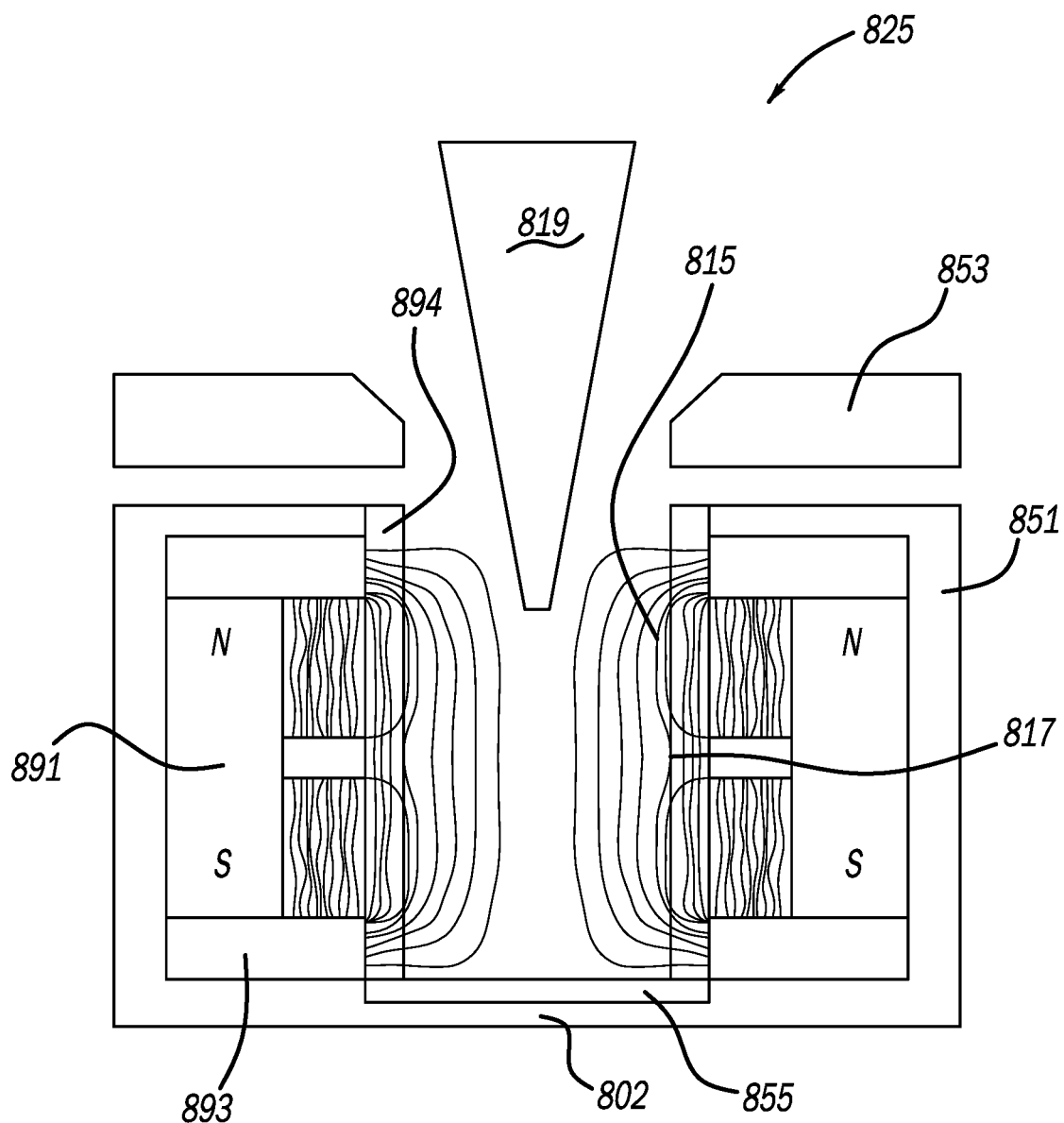
FIG. 17 is a cross-sectional view showing another embodiment of the present ion source.
Figure 18:
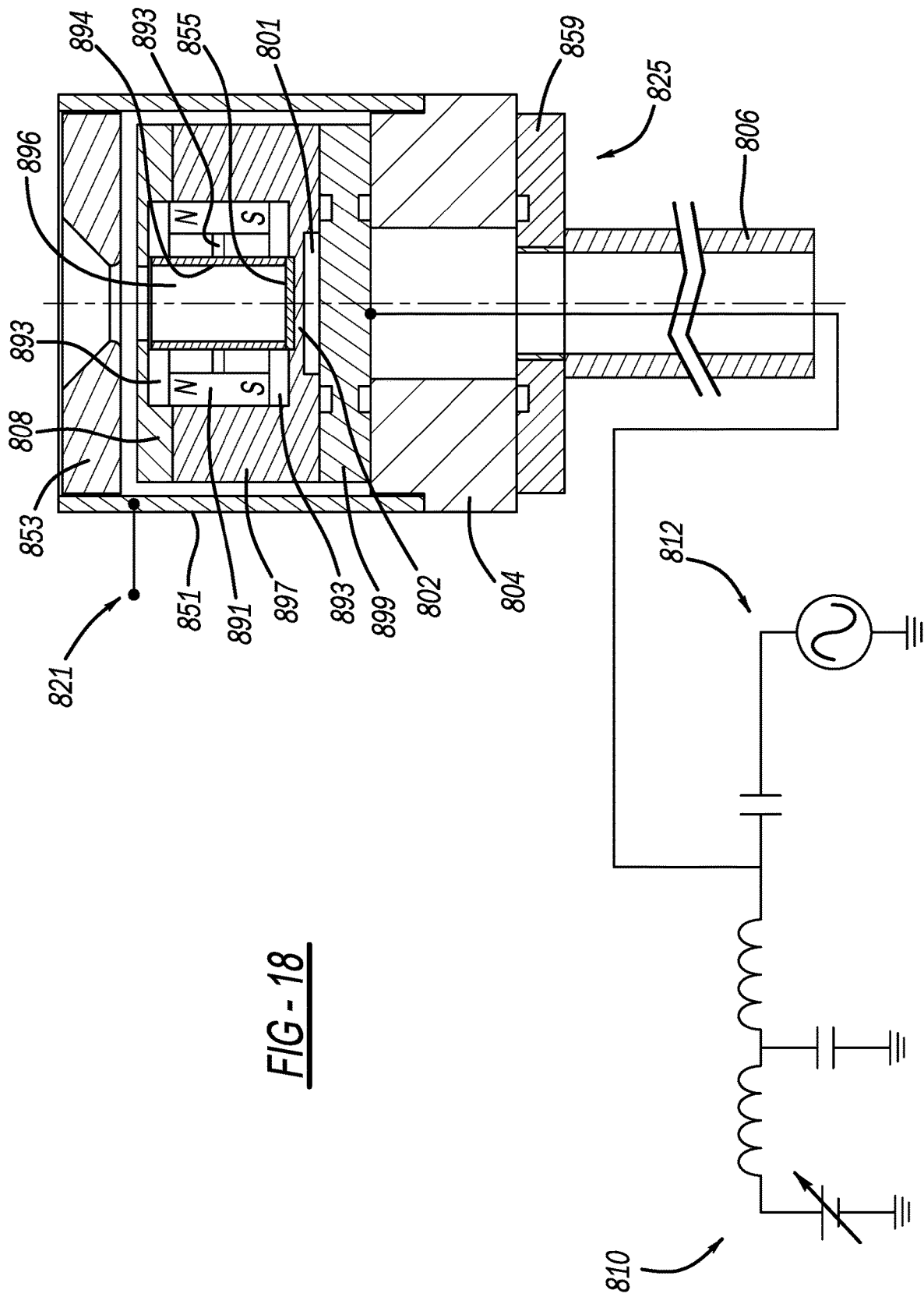
FIG. 18 is a cross-section view showing the embodiment of FIG. 17, of the present ion source.

Another embodiment of a single beam plasma or ion source apparatus 821 is shown in FIGS. 17 and 18. This construction is similar to the prior embodiments and includes an ion source 825 with an anode 851 and a cathode 853. Anode 851 is mounted upon first insulator 855 within an anode body 897. Anode body 897 further includes a middle segment 802 laterally spanning across a bottom of an open plasma region or area 896 against which contacts first insulator 855 in a lateral and parallel extending manner. An anode base 899 is sealed against a backside surface of anode body 897 with an optional incoming gas or cooling fluid inlet 801 centrally located therebetween. A second and thicker insulator 804 is located between base 899 and a vacuum sealing flange 859. Moreover, a center of second insulator 804, flange 859 and a longitudinally elongate pipe 806, are hollow.

Magnets 891 and magnetic shunts 893 are mounted within anode body 897 like with other embodiments described hereinabove. An electrically conductive and cylindrical internal cover 894 is also positioned within area 896 laterally in contact with internal ends of shunts 893 and with a bottom edge in longitudinal contact with first insulator 855. An annular rim 808 is coupled to an open end of anode body 897 and contains a circular recess on a backside thereof to receive an uppermost of shunts 893; rim 808 serves to clamp and secure the shunts, magnets and internal cover within the anode body. First insulator 855 has a peripheral edge with a lateral dimension or diameter which is less than or equal to an internal diameter or lateral dimension of magnet 891 and an inner edge of shunts 893.

A single ion beam 819 is emitted from ion source 825. Moreover, a dip 817 is present at a middle portion of at least some of magnet flux lines 815.

Apparatus 821 has a DC circuit 810 and an AC circuit 812 electrically connected to anode 851. The AC circuit optionally include RF. Ion source 825 is simultaneously excited by this DC and AC (or RF) multiple power source construction. Cathode 853, however, is always set at a floating potential at circuit 821, which is different than other embodiments.

The present embodiment of FIG. 18 has an electrically floating cathode, which causes a potential of the cathode to be slightly below that of the anode body. This configuration allows effective generation of secondary electrons without causing undesired sputtering of the cathode. This configuration is useful for applications where no electrons are supplied from an external source.

Figure 19:
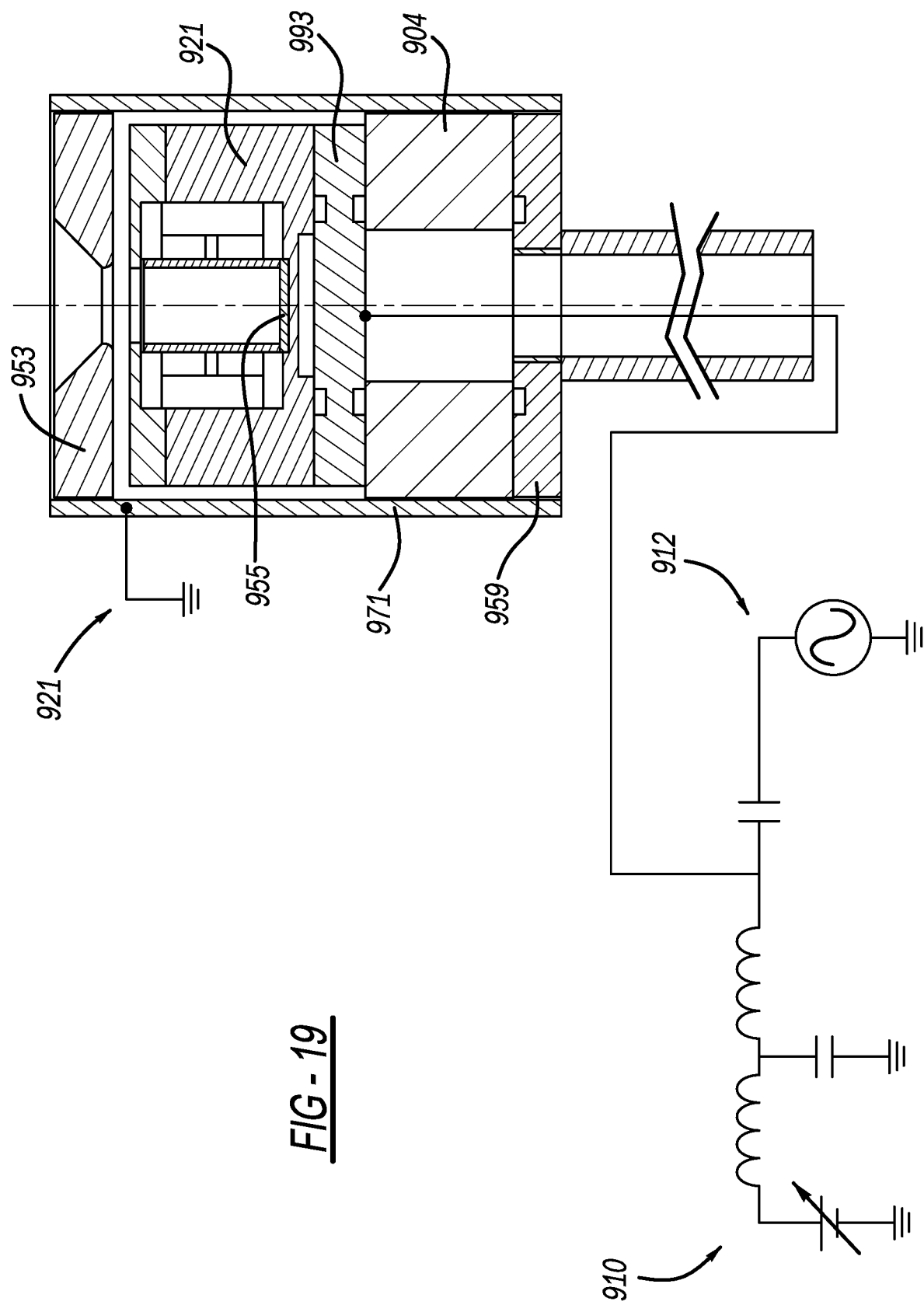
FIG. 19 is a cross-section view showing yet a further embodiment of the present ion source.

Finally, a further embodiment of a single beam plasma or ion source 921 is illustrated in FIG. 19. This version includes an ion source 925 with an anode 921 and cathode 953 like the prior embodiments. The differences are that a first insulator 955, an anode base 993, a second insulator 904 and a vacuum seal flange 959 are laterally and internally located within a cylindrical and longitudinally elongated external structural body 971 of cathode 953.

The DC and AC (or RF) circuits 910 and 912 are the same as in the other versions. But the cathode of circuit 921 is always at ground potential. This embodiment has an electrically grounded cathode, which creates a larger potential difference between the cathode and the anode body as compared to the floating cathode of the FIG. 18 version. This FIG. 19 configuration is less complex and more suitable for applications of ion source-enhanced sputtering.

The functional advantage of the first insulator 855 and 955 in the embodiments of FIGS. 18 and 19 is to create a surface with a floating electrical potential. This surface can prevent loss of energetic electrons to the anode under the first insulator which allows more efficient generation of plasma. However, this insulator is not necessary in some applications (for example, with the ion source-enhanced magnetron sputtering).

While various embodiments have been disclosed, it should be appreciated that other variations may be employed. For example, specific magnet and shunt quantities and shapes may be varied although some of the desired benefits may not be realized. Additionally, external body, insulator and base shapes and sizes may be varied, although certain advantages may not be achieved. Furthermore, exemplary target and specimen materials have been identified but other materials may be employed. Moreover, additional or different electrical components and circuits can be used, however, they may not function as well as the exemplary configurations shown herein. Each of the features may be interchanged and intermixed between any and all of the disclosed embodiments, and any of the claims may be multiply dependent on any of the others. While various applications of the single beam plasma or ion sources have been disclosed, using the sources for other applications, such as direct sputtering or etching a target surface, is not to be regarded as a departure from the spirit or the scope of the present invention. Additional changes and modification are not to be regarded as a departure from the spirit or the scope of the present invention.

The invention claimed is:

1. A plasma apparatus comprising an ion source apparatus, the ion source comprising:
   (a) an anode comprising at least one magnetic conductor and an open plasma area being located within a hollow central area of the anode;
   (b) a cathode comprising a cap having an outlet opening therethrough, the cathode further comprising a nonmagnetic body surrounding the magnetic conductor internally located within and spaced away from the body;
   (c) a direct current power source connected to the anode;
   (d) a radio frequency power source connected to the anode; and
   (e) ionization operably occurring within the plasma area inside the anode at least partially due to excitation by the direct current and radio frequency power sources.

2. The apparatus of claim 1, wherein the at least one magnetic conductor comprises multiple magnets or magnetic shunts which create a magnetic flux with a central dip in an open space wherein the plasma is created.

3. The apparatus of claim 2, wherein the magnets or magnetic shunts are arranged in a substantially E cross-sectional shape, and with a body or the cap of the cathode being a magnetic metal.

4. The apparatus of claim 1, wherein:
the cap of the cathode is magnetic and removable;
the cap is isolated from a body of the anode which surrounds the at least one magnetic conductor of the anode; and
an ion source discharge voltage is between 1-10 volts.

5. The apparatus of claim 1, further comprising:
a sputtering source acted upon by ions emitted through the outlet opening; and
a vacuum chamber within which is located the anode and the cathode, the chamber having an operating pressure of 1 mTorr to 500 mTorr.

6. The apparatus of claim 1, further comprising ions emitted through the outlet opening performing cleaning or evaporation deposition of thin films, and the ion source apparatus not using a filament.

7. The apparatus of claim 1, further comprising a single ion beam emitted through the outlet opening, the outlet opening being circular and having a cross-sectional diameter or width of 3-30 mm.

8. The apparatus of claim 1, further comprising:
a vacuum chamber within which is located the anode and cathode;
a reactive gas located in the chamber; and
a single ion beam, without a hollow center, created by the reactive gas and the excitation by the power sources.

9. The apparatus of claim 1, wherein:
the at least one magnetic conductor comprises multiple magnetic shunts with permanent magnets therebetween in a stacked and alternating arrangement, which create a magnetic flux in an open space wherein the plasma is created, narrow internal edges of the magnetic shunts face toward an ion emission centerline of the ion source; and
the direct current and the radio frequency power sources assist in causing emission of a stable ion beam.

10. The apparatus of claim 1, wherein the cathode is set at a floating potential.

11. The apparatus of claim 1, wherein:
the cathode is set at ground potential; and
the ionization enhances sputtering.

12. The apparatus of claim 1, further comprising:
a first insulator located adjacent to a middle segment of a body of the anode laterally defining part of the open plasma area opposite the outlet opening of the anode, a peripheral edge of the first insulator having a lateral dimension at or less than innermost edges of the magnetic conductor of the anode;
the magnetic conductor being at least one of magnets or magnetic shunts; and
at least a second insulator, having a hollow center and being longitudinally spaced away from the first insulator, and a lateral periphery of the second insulator having a greater dimension than the lateral dimension of the first insulator.

13. A plasma apparatus comprising an ion source apparatus, the ion source comprising:
(a) an anode comprising at least one magnetic conductor and an open plasma area being located within a hollow central area of the anode;
(b) a cathode comprising a cap having an outlet opening;
(c) a direct current power source connected to the anode, direct current power from the source being 10-300 volts;
(d) an alternating current or radio frequency power source connected to the anode;
(e) a vacuum chamber within which the anode and the cathode are located;
(f) a sputter deposition source located within the vacuum chamber; and
(g) a single ion beam emitted from the outlet opening of the cathode containing ions being substantially uniformly distributed around a center axis viewed in cross-section.

14. The apparatus of claim 13, wherein the radio frequency power source is connected to the anode, and the direct current and the radio frequency power sources assist in causing stable emission of the ion beam.

15. The apparatus of claim 13, wherein the alternating current power source is connected to the anode.

16. The apparatus of claim 13, further comprising a filter network isolates the power sources, and the ion source apparatus not using a filament.

17. The apparatus of claim 13, wherein:
(a) the cathode further comprises a nonmagnetic body surrounding the magnetic conductor internally located within and spaced away from the body; and
(b) there is simultaneous excitation of the ion source apparatus by:
both the direct current and the alternating current power sources; or
both the direct current and the radio frequency power sources.

18. The apparatus of claim 13, further comprising:
a first insulator located adjacent to a middle segment of a body of the anode laterally defining part of the open plasma area opposite the outlet opening of the anode a peripheral edge of the first insulator having a lateral dimension at or less than innermost edges of the magnetic conductor of the anode;
the magnetic conductor being at least one of magnets or magnetic shunts; and
at least a second insulator, having a hollow center and being longitudinally spaced away from the first insulator, and a lateral periphery of the second insulator having a greater dimension than the lateral dimension of the first insulator.

19. A method of using an ion source, the method comprising:
(a) supplying direct current electricity to an anode, which includes a magnet;
(b) supplying at least one of: alternating electricity and a radio frequency, to the anode simultaneous with step (a);
(c) setting a cathode, surrounding a portion of the anode, to a floating, ground or bias potential, the cathode including an outlet opening; and
(d) ionizing reactive gas within a vacuum, due at least in part to steps (a) and (b), to emit a single and stable ion beam, without a hollow center, out of the outlet opening.

20. The method of claim 19, further comprising sputtering a deposition material with the ion beam within the vacuum.

21. An ion source apparatus comprising:
(a) an anode comprising at least one magnetic conductor and an open plasma area being located within the anode;
(b) a cathode comprising a cap having an outlet opening therethough;
(c) a direct current power source connected to the anode;
(d) an alternating current or radio frequency power source connected to the anode;
(e) ionization operably occurring within the plasma area inside the anode at least partially due to excitation by the direct and alternating current power sources;
(f) the cap of the cathode being magnetic and removable;
(g) the cap being isolated from a body of the anode which surrounds the at least one magnetic conductor of the anode; and
(h) an ion source discharge voltage being between 1-10 volts.

22. The apparatus of claim 21, wherein:
the at least one magnetic conductor comprises multiple magnets or magnetic shunts which create a magnetic flux in an open space wherein the plasma is created; and
the magnets or magnetic shunts are arranged in a substantially E cross-sectional shape, and with a body of the cathode being a nonmagnetic metal, the body of the cathode concentrically surrounding and being spaced from the anode.

23. The apparatus of claim 21, further comprising:
a vacuum chamber within which is located the anode and cathode;
a reactive gas located in the chamber;
a single ion beam, without a hollow center, created by the reactive gas and the excitation by the power sources; and
ions emitted through the outlet opening performing cleaning or evaporation deposition of thin films.

24. The apparatus of claim 21, wherein the radio frequency power source is connected to the anode, an ion emission from the anode is a stable and single beam, without a hollow center in the beam, and the ion source apparatus is not using a filament.

25. The apparatus of claim 21, wherein the alternating current power source is connected to the anode, an ion emission from the anode is a stable and single beam, and the ion source apparatus is not using a filament.

26. A plasma apparatus comprising an ion source apparatus, the ion source comprising:
(a) an anode comprising at least one magnetic conductor and an open plasma area being located within the anode;
(b) a cathode comprising a cap having an outlet opening;
(c) a direct current power source connected to the anode;
(d) an alternating current or radio frequency power source connected to the anode;
(e) ionization operably occurring within the plasma area inside the anode at least partially due to excitation by the direct and alternating current power sources;
(f) a first insulator located adjacent to a middle segment of a body of the anode laterally defining part of the open plasma area opposite the outlet opening of the anode, a peripheral edge of the first insulator having a lateral dimension at or less than innermost edges of the magnetic conductor of the anode;
(g) the magnetic conductor being at least one of magnets or magnetic shunts; and
(h) at least a second insulator, having a hollow center and being longitudinally spaced away from the first insulator, and a lateral periphery of the second insulator having a greater dimension than the lateral dimension of the first insulator.

27. The apparatus of claim 26, further comprising:
a vacuum chamber within which is located the anode and cathode;
a reactive gas located in the chamber;
a single ion beam, without a hollow center, created by the reactive gas and the excitation by the power sources;
a body of the cathode being a nonmagnetic metal and concentrically surrounding and being spaced from the body of the anode; and
ions emitted through the outlet opening performing cleaning or evaporation deposition of thin films.

28. The apparatus of claim 26, wherein the radio frequency power source is connected to the anode.

29. The apparatus of claim 26, wherein the alternating current power source is connected to the anode.

30. The apparatus of claim 26, wherein there is simultaneous excitation of the ion source apparatus by:
both the direct current and the alternating current power sources; or
both the direct current and the radio frequency power sources.

* * * * *